US007751047B2

(12) United States Patent
Bijnen et al.

(10) Patent No.: US 7,751,047 B2
(45) Date of Patent: Jul. 6, 2010

(54) ALIGNMENT AND ALIGNMENT MARKS

(75) Inventors: Fransiscus Godefridus Casper Bijnen, Valkenswaard (NL); Henricus Wilhelmus Maria Van Buel, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 1373 days.

(21) Appl. No.: 11/194,758

(22) Filed: Aug. 2, 2005

(65) Prior Publication Data

US 2007/0031743 A1 Feb. 8, 2007

(51) Int. Cl.
G01B 11/00 (2006.01)
H01L 23/544 (2006.01)
G03F 9/00 (2006.01)
H01L 21/76 (2006.01)

(52) U.S. Cl. .................. 356/401; 257/797; 430/22; 438/401

(58) Field of Classification Search ................. None
See application file for complete search history.

(56) References Cited

U.S. PATENT DOCUMENTS

| 4,880,309 | A | | 11/1989 | Wanta | |
|---|---|---|---|---|---|
| 5,172,190 | A | * | 12/1992 | Kaiser | 356/401 |
| 5,731,877 | A | * | 3/1998 | Ausschnitt | 356/620 |
| 6,037,671 | A | * | 3/2000 | Kepler et al. | 257/797 |
| 6,141,107 | A | * | 10/2000 | Nishi et al. | 356/401 |
| 6,433,878 | B1 | * | 8/2002 | Niu et al. | 356/603 |
| 6,525,805 | B2 | | 2/2003 | Heinle | |
| 6,538,740 | B1 | * | 3/2003 | Shiraishi et al. | 356/401 |
| 6,628,406 | B1 | * | 9/2003 | Kreuzer | 356/508 |
| 6,768,539 | B2 | | 7/2004 | Gui et al. | |
| 7,002,763 | B2 | * | 2/2006 | Bui et al. | 360/48 |
| 2002/0109825 | A1 | * | 8/2002 | Gui et al. | 355/53 |
| 2003/0053057 | A1 | * | 3/2003 | Mishima | 356/401 |
| 2003/0176987 | A1 | * | 9/2003 | Nakajima | 702/159 |
| 2005/0133743 | A1 | | 6/2005 | Schets et al. | |
| 2007/0105029 | A1 | * | 5/2007 | Ausschnitt | 430/30 |

FOREIGN PATENT DOCUMENTS

| JP | 57026434 A | * | 2/1982 |
|---|---|---|---|
| JP | 02-122517 A | | 5/1990 |
| JP | 2001-93820 | | 4/2001 |
| KR | 2003-041015 | | 5/2003 |
| WO | WO 99/40613 | | 8/1999 |

OTHER PUBLICATIONS

Notice of Reasons for Rejection for Japanese Patent Application No. 2006-209334 dated Sep. 8, 2009.

* cited by examiner

*Primary Examiner*—Tarifur Chowdhury
*Assistant Examiner*—Gordon J Stock, Jr.
(74) *Attorney, Agent, or Firm*—Pillsbury Winthrop Shaw Pittman, LLP

(57) ABSTRACT

A lithographic substrate provided with an alignment mark, the alignment mark having a plurality of features spaced apart from one another, each feature being spaced apart from adjacent features by a different distance is disclosed. Further, there is disclosed a method of aligning a lithographic substrate provided with an alignment mark which has a plurality of features spaced apart from one another, each feature being spaced apart from adjacent features by a different distance, the method including measuring a distance between two of the features on the substrate, comparing the distance with a recorded set of distances, and determining from the comparison the position of the substrate.

17 Claims, 5 Drawing Sheets

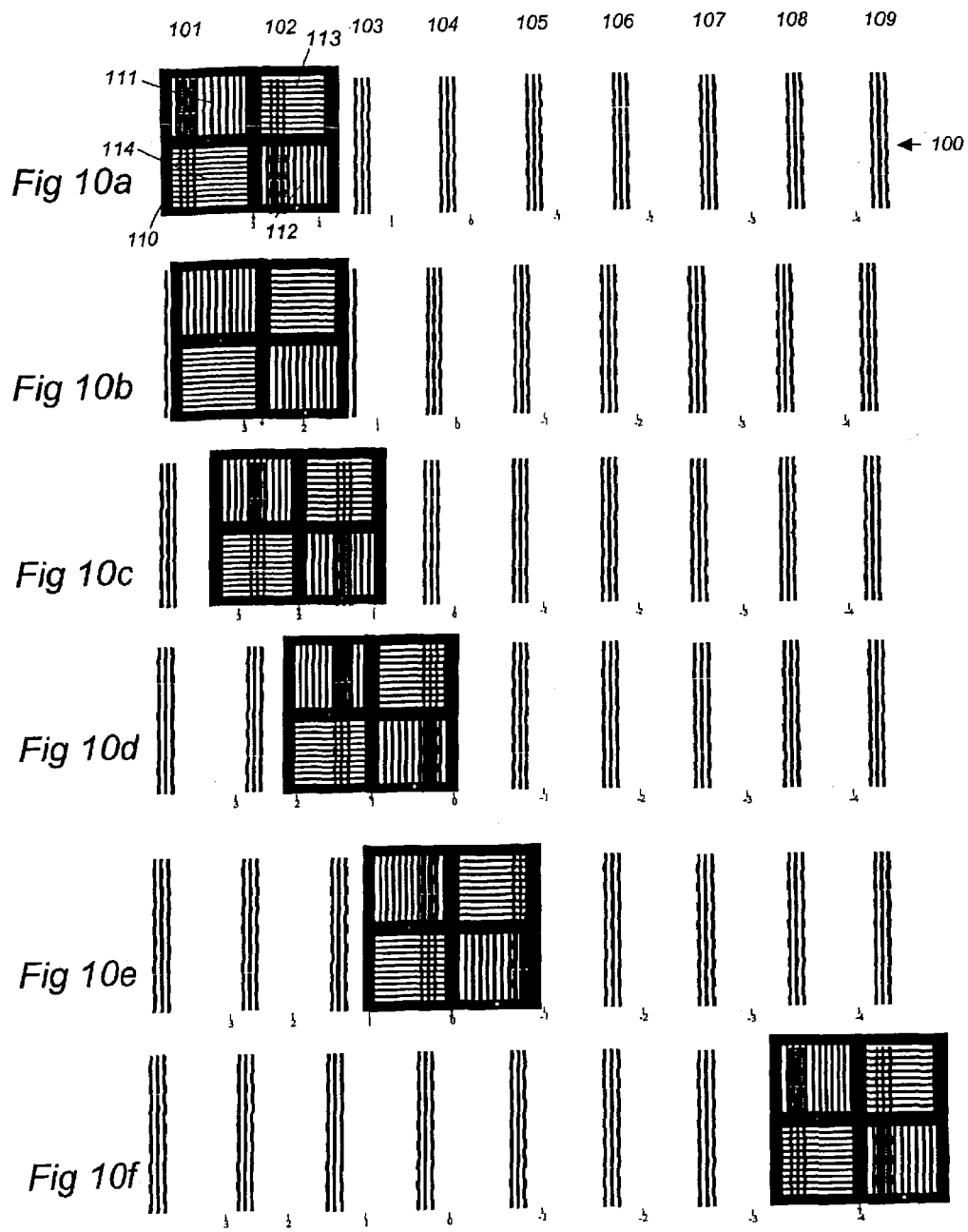

ALIGNMENT AND ALIGNMENT MARKS

1. FIELD

The present invention relates to alignment, alignment marks, and use thereof, e.g. in lithography.

2. BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

An example of alignment is the process of positioning the image of a specific point on a mask to a specific point on a substrate that is to be exposed. Often, the range of substrate positions over which alignment may be achieved is limited (this is sometimes referred to as the capture range). The limitation may arise from a combination of the configuration of an alignment mark provided on the substrate, and the operation of an alignment system arranged to detect the alignment mark.

3. SUMMARY

According to a first aspect of the invention, there is provided a substrate provided with an alignment mark, the alignment mark comprising a group of features, each feature being spaced apart from adjacent features by a different distance.

According to a second aspect of the invention, there is provided a method of aligning a lithographic substrate provided with an alignment mark which comprises a group of features, each feature being spaced apart from adjacent features by a different distance, the method comprising measuring a distance between two of the features on the substrate, comparing the distance with a recorded set of distances, and determining from the comparison the position of the substrate.

4. BRIEF DESCRIPTION OF THE DRAWINGS

Embodiments of the invention will now be described, by way of example only, with reference to the accompanying schematic drawings, in which:

FIG. 10(a-f) shows schematically the operation of the alignment system of FIG. 9.

5. DETAILED DESCRIPTION

Figure 1:
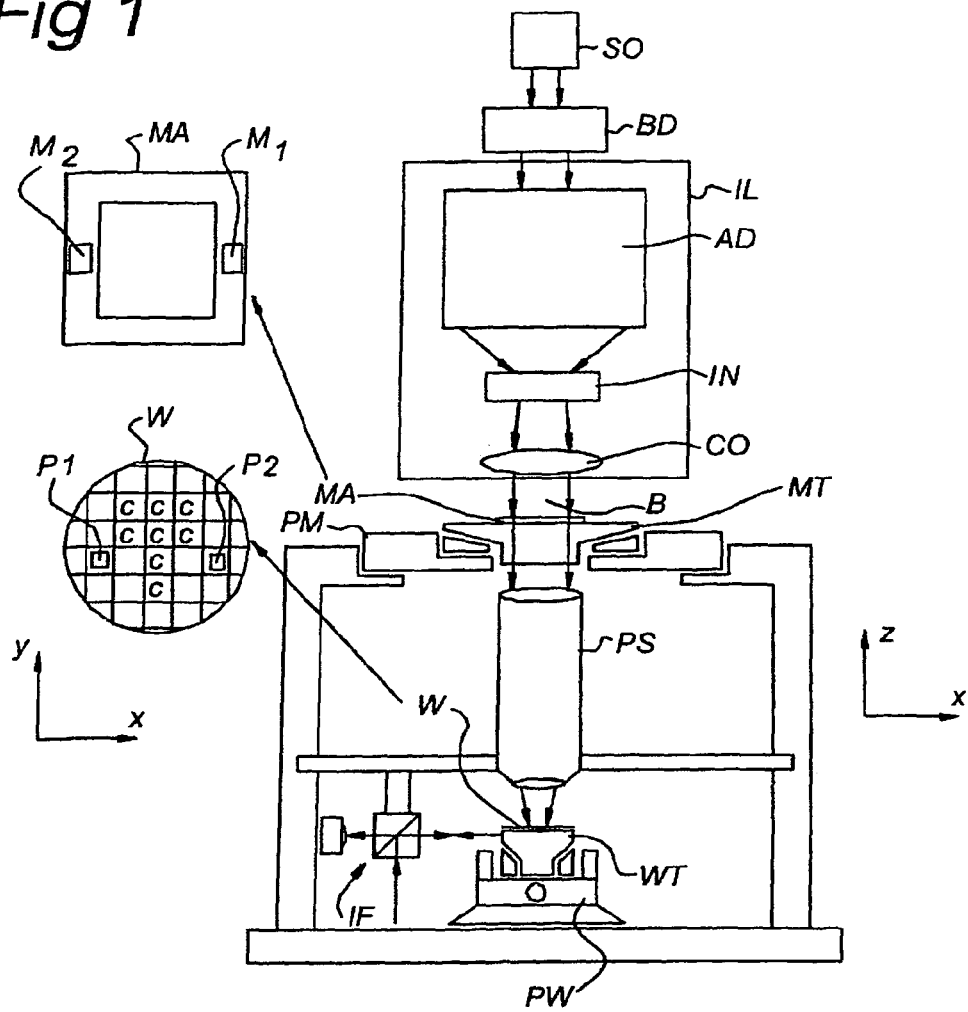
FIG. 1 illustrates a lithographic apparatus according to an embodiment of the invention.

FIG. 1 schematically depicts a lithographic apparatus according to one embodiment of the invention. The apparatus comprises:
- an illumination system (illuminator) IL configured to condition a radiation beam B (e.g. UV radiation or EUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a substrate table) WT constructed to hold a substrate (e.g. a resist-coated substrate) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as, for example, whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example, with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example, if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

In an exemplary embodiment of the invention, the apparatus is of a transmissive type (e.g. employing a transmissive mask). Alternatively, the apparatus may be of a reflective type (e.g. employing a programmable mirror array or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator may be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. In an embodiment, a resist layer is provided on the substrate. In an embodiment, the substrate W is a wafer, for instance a semiconductor wafer. In an embodiment, the wafer material is selected from the group consisting of Si, SiGe, SiGeC, SiC, Ge, GaAs, InP, and InAs. In an embodiment, the wafer is a III/V compound semiconductor wafer. In an embodiment, the wafer is a silicon wafer. In an embodiment, the substrate is a ceramic substrate. In an embodiment, the substrate is a glass substrate. Glass substrates may be useful, e.g., in the manufacture of flat panel displays and liquid crystal display panels. In an embodiment, the substrate is a plastic substrate. In an embodiment, the substrate is flexible. In an embodiment, the substrate is transparent (to the naked human eye). In an embodiment, the substrate is colored. In an embodiment, the substrate is absent a color.

With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) may be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks, as illustrated, occupy dedicated target portions, they may be located in spaces between target portions (these are known as scribe-lane alignment marks). Similarly, in situations in which more than one die is provided on the mask MA, the mask alignment marks may be located between the dies.

The depicted apparatus may be used in, e.g., one or more of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation may be readily applied to maskless lithography that utilizes programmable patterning device, such as a programmable mirror array of a type as referred to above.

Combinations and/or variations on the above described modes of use or entirely different modes of use may also be employed.

Figure 2:
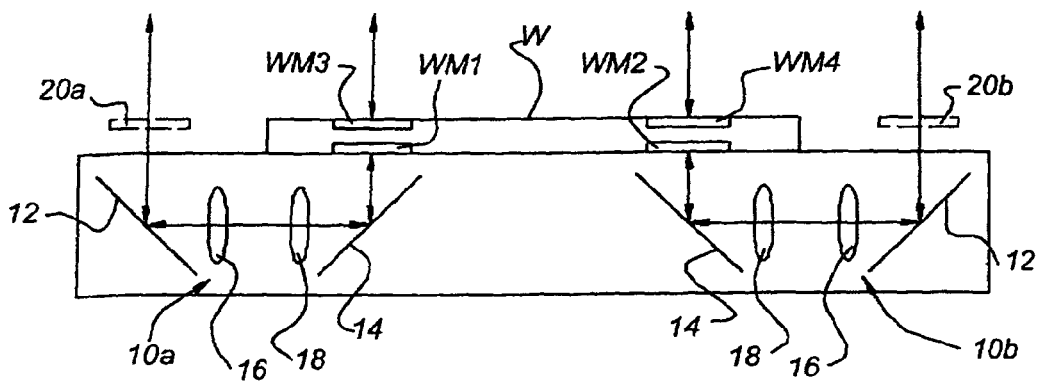
FIG. 2 is a schematic cross section illustrating the substrate table incorporating two branches of an optical system for double side alignment.

FIG. 2 shows a substrate W on a substrate table WT. Substrate marks WM3 and WM4 are provided on a first side ("front side") of the substrate W and light may be reflected from these marks, as indicated by the arrows above WM3 and WM4, and used for alignment with marks on a mask in conjunction with an alignment system (not shown). An example of such front side alignment is mentioned in more detail in U.S. patent application Ser. NO. 2005/0133743, filed 17 Dec. 2003, which is hereby incorporated by reference in its entirety.

Substrate marks WM1 and WM2 are provided on a second side ("back-side") of the substrate W. In lithography applications, the back-side of the substrate W is here intended to refer to the side of the substrate that is facing away from the side being exposed to radiation. An optical system is built into the substrate table WT for providing optical access to the substrate marks WM1, WM2 on the back-side of the substrate W. The optical system comprises a pair of arms 10a, 10b. Each arm comprises two mirrors, 12, 14 and two lenses 16, 18. The mirrors 12, 14 in each arm are inclined such that the sum of the angles that they make with the horizontal is 90°. In this way, a beam of light impinging vertically on one of the mirrors will remain vertical when reflected off the other mirror. Of course, other ways of obtaining the 180° change in direction can be thought of. For instance, the lenses and the mounting may be designed in such a way that they may take account of a large part of the direction change, as long as the total of the optical system provides a direction change of 180°.

In use, light is directed from above the substrate table WT onto mirror 12, through lenses 16 and 18, onto mirror 14 and then onto the respective substrate mark WM1, WM2. Light is reflected off portions of the substrate mark and returns along the arm of the optical system via mirror 14, lenses 18 and 16, and mirror 12. The mirrors 12, 14 and lenses 16, 18 are arranged such that an image 20a, 20b of the substrate mark WM1, WM2 is formed at the plane of the front (top) surface of the substrate W, corresponding to the vertical position of any substrate marks WM3, WM4 provided on the front side of the substrate W. The order of the lenses 16, 18 and the mirrors 12, 14 may be different, as appropriate to the optical system. For example, lens 18 may be between the mirror 14 and the substrate W (see illustrations of later embodiments).

Image 20a, 20b of substrate mark WM1, WM2 acts as a virtual substrate mark and may be used for alignment by the pre-existing alignment system (not shown) in exactly the same way as a real substrate mark provided on the front (top) side of the substrate W.

Figure 3:
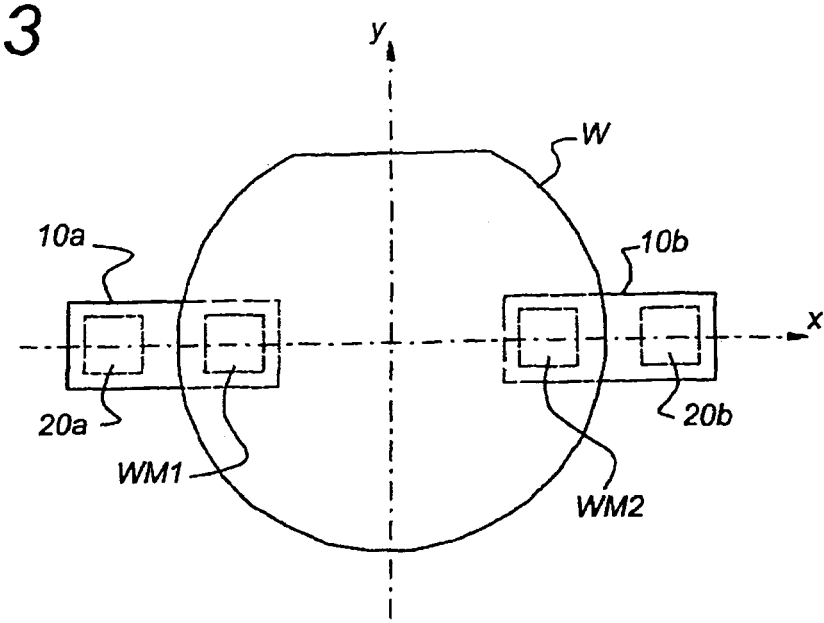
FIG. 3 is a plan view of a substrate showing the position and orientation of the double side alignment optics.
Figure 4:
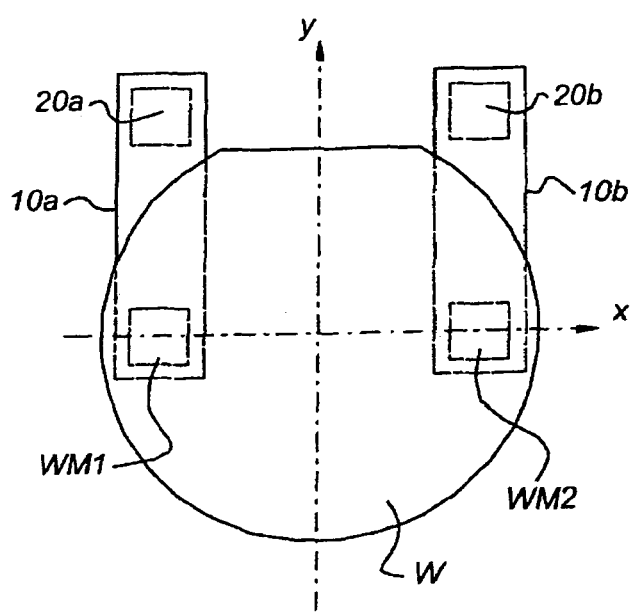
FIG. 4 is plan view showing an alternative position and orientation of the double side alignment optics.

As shown in FIG. 2, the arms of the optical system 10a, 10b produce images 20a, 20b which are displaced to the side of the substrate W so that they may be viewed by an alignment system above the substrate W. Two preferred orientations of the arms of the optical system 10a, 10b are shown in FIGS. 3 and 4, which are plan views of the substrate W, which lies in the XY plane. The substrate table WT is omitted from FIGS. 3 and 4 for clarity. In FIG. 3, the arms of the optical system 10a, 10b are substantially parallel to the X axis. In FIG. 4, the arms of the optical system 10a, 10b are substantially parallel to the Y axis. In both cases, the substrate marks WM1, WM2 lie on the X axis. The substrate marks WM1, WM2 are located on the underside of the substrate W, so they are reversed from the point of view of the top side of the substrate W. However, the arrangement of the mirrors 12, 14 of the arms of the optical system may be configured so that the images 20a, 20b of the substrate marks WM1, WM2 are restored to a proper orientation. Thus the images appear exactly the same as if they were on the top side of the substrate W. The optical system also may be arranged so that the ratio of the size of a substrate mark WM1, WM2 to its image 20a, 20b is 1:1 i.e. there is no magnification or reduction. Consequently, the images 20a, 20b can be used exactly as if they were real substrate marks on the front side of the substrate W. A common alignment pattern or key provided on a mask may be used to perform alignment with both real and virtual substrate marks.

In the current example, substrate marks are provided on both the front and back-sides of the substrate W at corresponding positions, as shown in FIG. 2. In FIGS. 3 and 4, only the substrate marks on the back-side of the substrate W are shown, for clarity. According to this arrangement, when the substrate W is flipped over, by rotation about either of the X or Y axes, a substrate mark that was on the top side of the substrate W now may be on the underside of the substrate W, but at a position such that it may be imaged by an arm of the optical system 10a, 10b.

It will be noted that, because of the mirror arrangement, displacement of the substrate W in one direction parallel to an arm 10a, 10b of the optical system will displace the corresponding image 20a, 20b of a substrate mark WM1, WM2 on the under side of the substrate in the opposite direction. For example, in FIG. 3, if the substrate W were displaced to the right, the images 20a, 20b would be displaced to the left. Software controlling the alignment system may take this into account when determining the position of the substrate marks WM1, WM2 and when adjusting the relative positions of the substrate W and a mask when performing alignment. If the two arms of the optical system 10a, 10b are symmetric then the separation between the images 20A and 20B will in fact stay constant when the substrate is displaced.

In an alternative embodiment of the invention, a substrate table WT may be provided with a mirror arrangement that does not change the direction of movement of the images 20a, 20b with respect to the movement of the substrate marks WM1, WM2.

At least two substrate marks may be provided on a side of the substrate W. A single mark may provide information about the relative positioning of an image of a specific point on a mask to a specific point on the substrate. However, to ensure the correct orientational alignment and magnification, at least two marks may be used.

Figure 5:
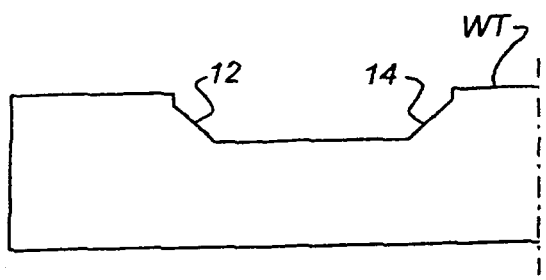
FIG. 5 is a cross section of a portion of a substrate table having integral optical components.

FIG. 5 shows a portion of the substrate table WT in cross section. According to one embodiment of the invention, the optical system 10a, 10b for imaging the substrate marks on the back-side of a substrate may be built into the substrate table WT in a particular fashion. As shown in FIG. 5, the mirrors 12, 14 of an arm of the optical system may not be provided as discrete components, but are integral with the substrate table WT. Appropriate faces are machined into the substrate table WT, which may then be provided with a coating to improve reflectivity, thus forming the mirrors 12, 14. The optical system may be made from the same material as the substrate table, such a Zerodur™, which has a very low coefficient of thermal expansion and therefore ensures that high alignment accuracy can be maintained.

The substrate marks WM1, WM2, WM3, WM4 may be provided on the substrate W in order to allow alignment of the substrate W with respect to the projected patterned beam. Alignment is desirable for proper positioning of different layers of the substrate W with respect to each other. A substrate W may be built up from a plurality of layers that are each formed on the substrate W one after the other and are subject to an exposure. Since the different layers are configured to form a working device, the different exposures should be optimally aligned with respect to each other.

Figure 6:
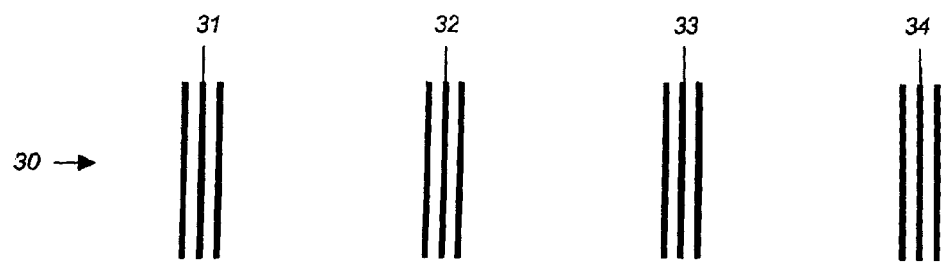
FIG. 6 is a schematic illustration of an alignment mark according to an embodiment of the invention.

An alignment mark according to an embodiment of the present invention may be used to ensure that the capture range of the alignment system is sufficiently large. The capture range is the range of positions of the substrate over which correct alignment of the substrate may be achieved. An example of an alignment mark, generally indicated as 30, is shown in FIG. 6. The alignment mark 30 comprises four sets of three lines 31-34. Each set of lines 31-34 comprises three lines, each line being 8 microns thick and being separated from adjacent lines by 8 microns.

Each set of lines 31-34 of the alignment mark 30 is separated from adjacent sets of lines by a different sized gap. In an embodiment, the first set of lines 31 (counting from the left-hand side of FIG. 6) is separated from the second set of lines 32 by 177 microns, the second set of lines 32 is separated from the third set of lines 33 by 178 microns, and the third set of lines 33 is separated from the fourth set of lines 34 by 179 microns.

Figure 7:
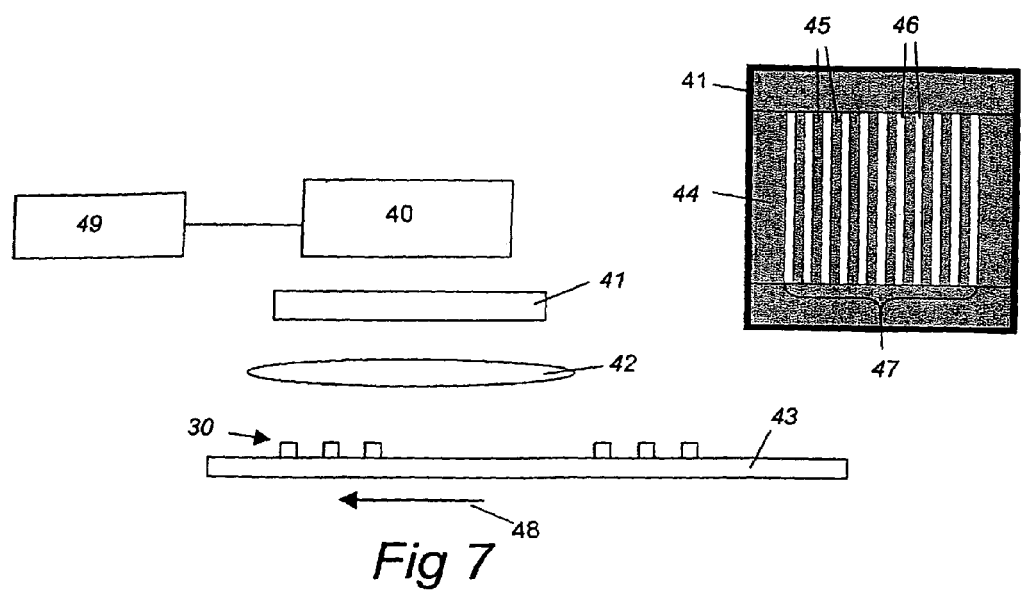
FIG. 7 is a schematic illustration of an alignment system which may be used to measure the position of the alignment mark shown in FIG. 6.

An alignment system which may be used to determine the location of a substrate provided with the alignment mark 30 is shown in FIG. 7. The alignment system comprises a detector 40, a detection grating plate 41 and a lens 42. A substrate 43 provided with the alignment mark 30 is located beneath the alignment system. For ease of illustration, the alignment mark 30 is not shown as being on the back-side of the substrate 43, but is instead on the front side of the substrate. It will be appreciated however that the alignment mark may be provided on the back-side of the substrate 43, with the apparatus shown in FIGS. 2 to 5 being used to form an image of the alignment mark beneath the lens 42.

FIG. 7 also shows schematically the detection grating plate 41 as viewed from beneath. The detection grating plate 41 comprises a quartz plate provided with masking 44 around its edges, and a series of 8 micron thick lines of masking material 45 each separated from one another by 8 micron gaps 46. The lines 45 and gaps 46 together form a detection grating 47 which has the same period as the sets of lines 31-34 (see FIG. 6) which comprise the alignment mark 30. In an embodiment, the gap between the sets of lines 31-34 is greater than the width of the detection grating 47. In this example the width of the detection grating 47 is 168 microns. In an embodiment, the width of the detection grating 47 is sufficiently small such that there is a position of the detection grating 47 for which no set of lines 31-34 is visible. Since the separation between adjacent sets of lines 31-34 is at least 177 microns, this means that, in this embodiment, the maximum width of the detection grating 47 should be 176 microns. A width significantly smaller than this, for example 168 microns, is desired, because this provides a stronger zero signal (the zero signal is the signal that arises if no sets of lines 31-34 are visible to the detection grating 47).

In use, the substrate 43 may be scanned through 496 microns beneath the lens 42, as indicated schematically in FIG. 7 by an arrow 48. The lens images each set of lines 31-34 onto the detection grating 41. The detector 40 may be a large area photodiode, having a single output which indicates the amount of light transmitted by the detection grating 47. The signal output by the detector 40 comprises a sine-wave, which is caused by the sets of lines 31-34 alternating between being aligned with the lines 45 of the detection grating 47 and being aligned with the gaps 46.

The scan of the substrate 43 beneath the lens 42 is sufficiently long to ensure that two sets of lines 31-34 are detected by the detector 40. The scan length of 496 microns ensures that this is the case, and furthermore that the two sets of lines 31-34 have passed fully beneath the detection grating 47. The scan may be less than 496 microns, and may be, e.g., as little as 272 microns. 272 microns is sufficient to ensure that two sets of lines 31-34 are detected by the detector, although the sets of lines may not pass fully beneath the detection grating 47.

Since the separation between each set of lines 31-34 is different, the separation measured by the detector 40 between two adjacent sets of lines can be used to determine which sets of lines have been measured, and therefore used to determine the location of the substrate 43 with respect to the detector 40. This may be done by comparing the measured separation between the sets of lines with data regarding the sets of lines which is stored in a memory 49. Once the identity of the measured sets of lines has been determined, the location of the substrate 43 with respect to the detector 40 can be found by measuring the position of one of the sets of lines. This measurement may be performed during the scan referred to above, or may be performed during a separate dedicated scan.

When the gap between the sets of lines 31-34 is greater than the width of the detection grating 47, there will be a period during the scan which is signal free (i.e. there is no modulation of the signal), allowing a distinction to be made between each set of lines.

An advantage of the embodiment of the invention is that it may be used to provide a very long capture range, for example 1 millimeter or more.

Although a particular alignment system has been illustrated in FIG. 7, it will be appreciated that any other suitable alignment system may be used, and that many such alignment systems are known in the art. Furthermore, it will be appreciated that it is not required that there is a one-to-one relationship between the separation of the lines 45 of the detection grating 47 and the lines of the alignment mark 30. For example, if a lithographic projection system is located between the substrate 43 and the detector 40, then a reduction factor of 4 will typically arise from the projection system. In this example the separation of the lines 45 of the detection grating would be 32 microns instead of 8 microns.

Although each set of lines 31-34 is shown in FIG. 6 as comprising three lines, it will be appreciated that a different number of lines may be used. A greater number of lines will increase the signal to noise ratio of the signal output from the detector 40. However, if more lines are used then total length of the alignment mark will be increased, and the length of scan needed will also increase. When detection apparatus of the type shown in FIG. 7 is used, at least three lines are desired, because this allows the detector 40 to provide a signal which may be used to obtain accurate alignment. It will be appreciated however that where other detector arrangements are used, less lines per set of lines may be required. Indeed, a single line may be used in place of each set of three lines 31-34. In an embodiment, the number of lines is in the range of 1-10, e.g. 1-5 or 1-3.

Although the alignment mark 30 comprises four sets of lines 31-34, it will be appreciated that the alignment mark may comprise any other number of sets of lines. In an embodiment, the mark comprises at least 2 sets of lines, e.g. at least 4 sets of lines or at least 8 sets of lines.

Figure 8:
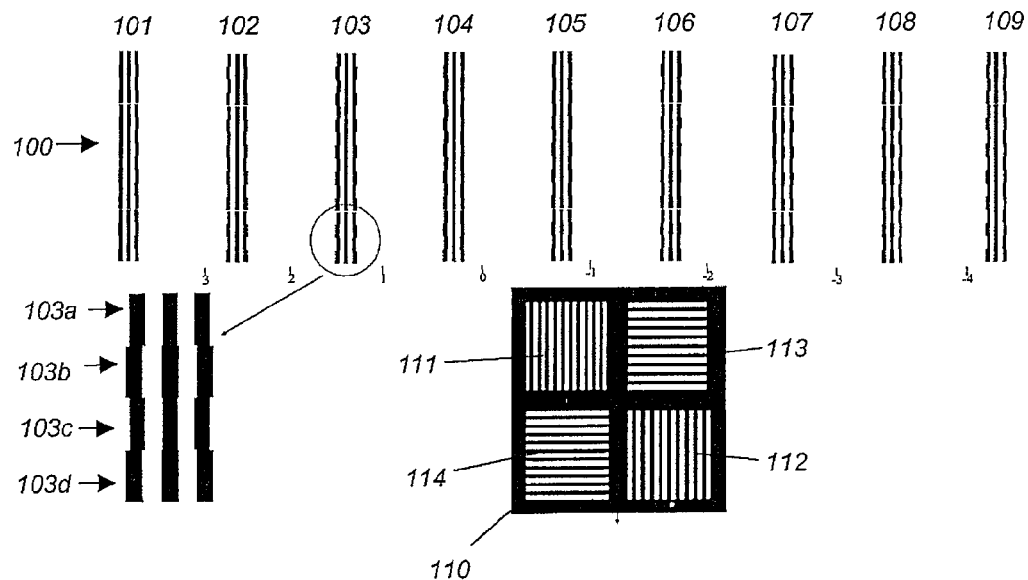
FIG. 8 is a schematic illustration of an alignment mark according to an alternative embodiment of the invention.

FIG. 8 shows an alternative embodiment of the invention. An alignment mark 100 shown in FIG. 8 comprises nine sets of lines 101-109, each separated from adjacent sets of lines by a different sized gap.

Each set of lines 101-109 has the same structure. A small portion of the third set of lines 103 (counting from the left) is shown enlarged in FIG. 8. From this it can be seen that the third set of lines 103 comprises three lines, each of which is separated into segments. A first set of segments 103a comprises three lines 8 microns in width, separated by gaps of 8 microns. A second set of segments 103b comprises three lines 8.8 microns in width, separated by gaps of 8.8 microns. A third set of segments 103c has the same structure as the first set of segments 103a, and a fourth set of segments 103d has the same structure as the second set of segments 103b. This structure is repeated throughout the length of the third set of lines 103, and is also used in the other sets of lines 101, 102, 104-109.

FIG. 8 also shows a detection grating plate 110. The detection grating plate 110 comprises four windows, each of which is provided with a different detection grating. A first window 111 is provided with a detection grating which extends in the same direction as the lines 101-109, the detection grating comprising lines of masking material 8 microns in width separated by gaps of 8 microns. A second window 112 is also provided with a detection grating, but this detection grating comprises lines of masking material 8.8 microns in width separated by gaps of 8.8 microns. There are ten lines of masking material in the first window 111, whereas there are only nine lines of masking material in the second window 112. This is because the first and second windows 111, 112 have the same dimensions whereas, as described above, the lines and gaps have different dimensions. A corresponding arrangement of lines and gaps is provided in third and fourth windows 113, 114 of the detection grating plate 110. These are used for alignment in a direction perpendicular to the orientation of the alignment mark 100.

Figure 9:
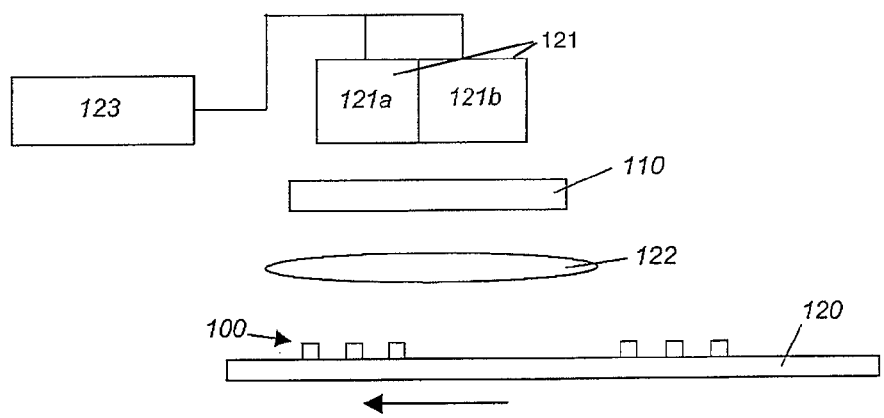
FIG. 9 is a schematic illustration of an alignment system which may be used to measure the position of the alignment mark shown in FIG. 8.

FIG. 9 shows an alignment system which may be used to determine the location of a substrate 120 provided with the alignment mark 100. The alignment system includes a detector 121 comprising four large area photodiodes two of which 121a, 121b are visible in FIG. 9. The detection grating plate 110 is located beneath the detector 121, and is positioned so that light which passes through a given window 111-114 is incident upon only on large area photodiode. A lens 122 is located beneath the detection grating plate 110, and is used to focus light reflected from the substrate 120, so as to form an image of the alignment mark 100 upon the detection grating plate 110. The detector 121 is connected to a memory 123.

The substrate 120 provided with the alignment mark 100 is located beneath the alignment system. For ease of illustration, the alignment mark 100 is not shown as being on the backside of the substrate 120, but instead on the front side of the substrate. It will be appreciated however that the alignment mark 100 may be provided on the back-side of the substrate 120, with the apparatus shown in FIGS. 2 to 5 being used to form an image of the alignment mark beneath the lens 122.

As previously mentioned, each set of lines 101-109 of the alignment mark 100 is separated from adjacent sets of lines by a different distance. This distance is selected so that it is not possible for more than one set of lines 101-109 to be visible at each of the first or second windows 111, 112 at any given time. In addition, the separation is arranged so that for a pair of adjacent sets of lines, there is a position of the detection grating plate 110 which will allow a first set of lines to be viewed through the first window 111 and will allow a second set of lines to be viewed through the second window 112. Furthermore, the separation of adjacent sets of lines 101-109 is arranged such that when no lines are visible through the first window 111, no lines are visible through the second window 112. In this example, the separation between each adjacent set of lines 101-109 is shown in Table 1. It will be appreciated that a separation may be expressed more generally, as a standard fixed amount plus an additional varying amount, and this is also expressed in Table 1 (the fixed amount being indicated by X). The separation between the sets of lines is selected so that the distance between any two adjacent measured aligned positions is 16 microns. Due to the effect of having a grating in the first window 111 with a period of 16 microns and a grating in the second window 112 with a period of 17.6 microns, the actual separations between adjacent sets of lines does not vary by 16 microns, but instead varies by a lesser amount.

TABLE 1

| Set of Lines | Set of Lines | Separation Between Sets of Lines | General Expression of Separation |
|---|---|---|---|
| 101 | 102 | 176 − 9.6 microns | X − 6*(17.6−16) |
| 102 | 103 | 176 − 4.8 microns | X − 3*(17.6−16) |
| 103 | 104 | 176 − 1.6 microns | X − 1*(17.6−16) |
| 104 | 105 | 176 microns | X |
| 105 | 106 | 176 microns | X |
| 106 | 107 | 176 + 1.6 microns | X + 1*(17.6−16) |
| 107 | 108 | 176 + 4.8 microns | X + 3*(17.6−16) |
| 108 | 109 | 176 + 9.6 microns | X + 6*(17.6−16) |

Use of an embodiment of the invention is illustrated in FIG. 10, which shows the detection grating 110 in six different positions with respect to the alignment mark 100. Referring to FIG. 10a, the detection grating plate 110 is located such that the first set of lines 101 of the alignment mark 100 is aligned with gaps of the grating provided in the first window 111, and the second set of lines 102 is aligned with gaps of the grating provided in the second window 112. This provides a peak signal from the photodiodes 121 which are located above the first and second windows 111, 112. The peak signal is interpreted by alignment software as indicating that the detection grating plate 110 is correctly aligned with the first and second sets of lines 101, 102. The position of the detection grating plate 110 is indicated by an arrow at the bottom of the detection grating plate 110, which points to the number '3'. The number 3 thus indicates the aligned position for the combination of the first set of lines and the second set of lines.

It will be appreciated that, because the first set of lines 101 comprises segments of 8 micron thick lines separated by 8 microns and segments of 8.8 micron thick lines separated by 8.8 microns, only the 8 micron segments will be aligned with the gaps of the grating provided in the first window 111 of the detection grating plate. There is no position of the first window 111 which will align it with the segments of 8.8 micron lines, and so no significant signal is detected in relation to these segments through the first window 111. Similarly, the segments of 8.8 micron thick lines separated by 8.8 microns provide the signal which is detected through the second window 112 of the detection grating plate 110.

There is only one position of the detection grating plate 110 (the position labeled number 3) at which the segments of 8 micron thick lines will properly align with the gaps of the grating provided in the first window 111, and the segments of 8.8 micron thick lines will properly align with the gaps of the grating provided in the second window 112. This allows alignment software to accurately determine the location of the substrate with respect to the detection grating plate 110 (as described below).

FIG. 10b shows the detection grating plate 110 located further to the right (e.g., the alignment mark 100 moved to the left), so that none of the sets of lines 101-109 are visible through the first or second windows 111, 112. When the detection grating plate 110 is alignment signal is output to the alignment software.

FIG. 10c shows the detection grating plate 110 located further to the right, at a location in which the second set of lines 102 are aligned with gaps in the first window 111, and the third set of lines 103 are aligned with gaps in the second window 112. This aligned position is labeled in FIG. 10c as number 2.

The separation between aligned position 3 and aligned position 2 is measured as being 224 microns. The separation between each set of lines 101-109 is already known, as is the resulting distances that will be measured between aligned positions. The full set of distances between measured aligned positions is shown in Table 2. The measured separation between aligned positions of 224 microns will only occur for aligned positions 3 and 2. Therefore, the position of the substrate in relation to the detection grating plate 110 can be determined with reference to data stored in the memory 123. Table 2 also includes a general expression of the distances between measured aligned positions.

TABLE 2

Aligned differences between two mark positions

| Aligned Position Number | Aligned Position Number | Measured Distance between Aligned Positions | General Expression of Distance between Aligned Positions |
|---|---|---|---|
| 3 | 2 | 176 + 48 microns | X + 3* 16 |
| 2 | 1 | 176 + 32 microns | X + 2* 16 |
| 1 | 0 | 176 + 16 microns | X + 1* 16 |
| 0 | −1 | 176 microns | X + 0* 16 |
| −1 | −2 | 176 − 16 microns | X − 1* 16 |
| −2 | −3 | 176 − 32 microns | X − 2* 16 |
| −3 | −4 | 176 − 48 microns | X − 3* 16 |

To further illustrate the operation of this embodiment of the invention, FIGS. 10d to 10f illustrate the detection grating when it is located at aligned positions 1, 0 and −4.

It will be appreciated that in an alternative embodiment of the invention, the values given in Tables 1 and 2 may be changed by swapping their signs (i.e. subtracting microns instead of adding them, and vice versa).

It will be appreciated that in order for alignment of a substrate to work correctly, the substrate is scanned beneath the detection grating plate 110 sufficiently far that two aligned positions pass beneath the detector plate. This ensures that the distance between two aligned positions can be measured, thereby allowing the location of the substrate to be determined.

As described above, each set of lines 101-109 comprises three lines, each line being separated into segments which alternate between 16 micron periods and 17.6 micron periods. It will be appreciated that it is not necessary that the lines be separated into segments. For example, the lines may comprise an upper portion which has a 16 micron period and a lower portion which has a 17.6 micron period. Where this is done, the portions are arranged such that the upper portion is seen through the first window 111 of the detection grating plate 110, and the lower portion is seen through the second window 112 of the detection grating plate. Other suitable configurations of lines will be apparent to those skilled in the art. The use of segmented lines is advantageous because it avoids alignment errors occurring in the event that the substrate 120 is not properly aligned with the direction of scan beneath the detection grating plate 110 (i.e. due to rotation effects). The period of the segmentation is chosen such that it is not 16 microns or 17.6 microns, or any multiple thereof (or values close to these), in order to avoid the segmentation causing interference with the alignment measurement when alignment is performed in the orthogonal direction (conventionally alignment of the substrate is performed in two orthogonal directions). Irrespective of whether or not the lines are segmented, the lines should be arranged such that there is a position of the detection grating plate 110 for which photodiodes 121 located above the first window 111 and the second window 112 both provide peak outputs.

It will be appreciated that the periods of the sets of lines in the above described embodiments, and the separations between the sets of lines, are given as an example only. Any other suitable period may be combined with any other suitable separation. For example, in the embodiment described in relation to FIGS. 8 and 9, it is mentioned that the separation of adjacent sets of lines 101-109 is arranged such that when no lines are visible through the first window 111, no lines are visible through the second window 112. Although this arrangement allows an easy measurement approach to be used, other separations between the sets of lines may be used. In general, the sets of lines 101-109 are separated by a maximum distance which corresponds with the separation between the gap of the first window 111 which is furthest to the left and the gap of the second window 112 which is furthest to the right. The sets of lines 101-109 are separated by a minimum distance which corresponds with the separation between the gap of the first window 111 which is furthest to the right and the gap of the second window 112 which is furthest to the left. These limits stem from the requirement that a neighbor of a given set of lines 101-109 must be at least partly visible to the detector 121 when at least part of the given set of lines is visible to the detector 121. In an embodiment, the separation between the sets of lines 101-109 is sufficient that a zero signal (i.e. the absence of a set of lines) will be seen through the windows 111, 112 during scanning when the first window is between adjacent sets of lines. This is desired because the zero signal allows signals associated with individual sets of lines 101-109 to be identified. The zero signals do not need to occur simultaneously at the first and second windows 111, 112. It is not essential that the separation between the sets of lines 101-109 be sufficient that a zero signal occurs. If there is no zero signal, complex data analysis is required in order to identify and separate the signals caused by given sets of lines 101-109.

As mentioned further above, the alignment mark 30, 100 may be provided on the back-side of the substrate 43, 120, or front side on the substrate, or both the front and backside may be provided with an alignment mark. Providing the alignment mark 30, 100 on the back-side of the substrate 43, 120 has the advantage that the alignment mark does not occupy real estate on the front side of the substrate that could otherwise have been used for integrated circuits or other devices. If the alignment mark 30, 100 is provided on the front side of the substrate 43, 120, then it may be located in scribe lanes between integrated circuits (or other devices) to avoid occupying real estate intended to be used for integrated circuits or other devices. It may be the case that lithographic exposure is to be used on both sides of the substrate, for example to fabricate micro systems technology (MST) and micro electro-mechanical systems (MEMS) devices. Where this is done, the alignment mark 30, 100 may be provided in scribe lanes on the back-side of the substrate.

The above described embodiments of the invention refer to a peak of the detected signal when the detection grating plate 41, 110 is aligned with one or more sets of lines. It will be appreciated that the detected signal may in fact have a trough rather than a peak, and that this depends upon the form of the sets of lines 31-34, 101-109 provided on the substrate 43, 120.

The alignment mark 30, 100 may be applied to the substrate 43, 120 during manufacture of the substrate, rather than being applied to the substrate as one step of a series of lithographic steps used to image an integrated circuit or other device onto the substrate.

An additional alignment mark (not illustrated) may be provided on the substrate 43, 120 in a direction orthogonal to the direction of the illustrated alignment mark. In use, each alignment mark is scanned beneath the detection grating plate 41, 110, to allow the substrate to be aligned in two orthogonal directions.

Although the embodiments of the invention have been described in relation to an alignment system which comprises a detection grating plate 41, 110 and a large area photodiode (s) 40, 121, it will be appreciated that other systems for detecting the position of the alignment mark may be used. For example, an imaging detector may be used. The imaging detector could, for example, be arranged to provide an output signal from which amplitude data of the type generated by photodiodes could be calculated. The use of an imaging detector may have the advantage that it allows more simple data analysis in the case where there is no zero signal (see above), since contributions to an output signal which arise from different sets of lines may be easily identified using the imaging detector.

It will be appreciated that references in the above description to determining the position of the substrate using the alignment mark 30, 100 may refer to determining the position relative to elements of integrated circuits (or other devices or elements) which have been lithographically transferred onto the substrate. This is advantageous, since it ensures that each layer which is lithographically transferred to the substrate is properly aligned with existing layers.

Although embodiments of the invention have been described in which the substrate 43, 120 is scanned beneath the detector 41, 121 of the alignment system, it will be appreciated that the detector (and possibly other parts of the alignment system) may be scanned over the substrate.

Although specific reference may be made to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 436, 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective; magnetic, electromagnetic and electrostatic optical components.

Throughout the above, reference to the alignment mark being located on a particular side of the substrate includes the alignment mark being etched into a respective side of the substrate and includes having subsequent material deposited on top of the alignment mark such that it is embedded and is no longer necessarily exposed at the surface.

Other embodiments, uses and advantages of the invention will be apparent to those skilled in the art from consideration of the specification and practice of the invention disclosed herein. The specification should be considered exemplary only, and the scope of the invention is accordingly intended to be limited only by the following claims.

What is claimed is:

1. A substrate provided with an alignment mark, the alignment mark comprising a group of features, wherein each feature comprises a set of a plurality of lines and each feature is spaced apart from adjacent features in the group by a different distance, wherein the lines of each set of lines are periodically spaced, and include a first part spaced apart by a first period and a second part spaced apart by a second period.

2. The substrate according to claim 1, wherein each set of lines comprises at least three lines.

3. The substrate according to claim 1, wherein the difference in distance between each set of lines includes a multiple of the difference between the first period and the second period.

4. The substrate according to claim 1, wherein the alignment mark is provided in a scribe lane of the substrate.

5. The substrate according to claim 1, wherein the alignment mark is one of a pair of alignment marks which extend orthogonally from one another on the substrate.

6. The substrate according to claim 1, wherein said alignment mark consists essentially of said group of features.

7. The substrate according to claim 1, wherein the lines are segmented, with the first part of the lines and the second part of the lines alternating with one another.

8. The substrate according to claim 7, wherein the period of the segmentation is not the same as, or a multiple of, the first, period or the second period.

9. A method comprising exposing to patterned radiation a substrate provided with an alignment mark, the alignment mark comprising a group of features wherein each feature comprises a set of a plurality of lines and each feature is spaced apart from adjacent features in the group by a different distance, wherein the lines of each set of lines are periodically spaced, and include a first part spaced apart by a first period and a second part spaced apart by a second period.

10. The method of claim 9, wherein the alignment mark is provided on a side of the substrate facing away from the side being exposed to the patterned radiation.

11. An integrated circuit or micro-electro-mechanical device obtained with the method of claim 9.

12. The method according to claim 9, wherein the lines are segmented, with the first part of the lines and the second part of the lines alternating with one another.

13. A method of aligning a substrate provided with an alignment mark which comprises a group of features, each feature comprising a set of a plurality of lines and each feature being spaced apart from adjacent features by a different distance, wherein the lines are periodically spaced from one another, and include a first part spaced apart by a first period and a second part spaced apart by a second period, the method comprising measuring a distance between two of the features on the substrate, comparing the distance with a recorded set of distances, and determining from the comparison the position of the substrate.

14. The method according to claim 13, wherein the method further comprises moving the substrate or an alignment detector relative to the other over a range of motion such that at least two features are detected by the detector.

15. The method according to claim 13, wherein the method further comprises determining a location of at least one of the features.

16. The method according to claim 13, wherein the method further comprises determining a position in which the first part of a first set of lines is aligned with a first detector and the second part of a second set of lines is aligned with a second detector.

17. The method according to claim 16, wherein the method further comprises relatively moving the substrate or the alignment detectors to the other over a range of motion such that at least one further set of lines is detected by at least one of the detectors.

* * * * *